(12) United States Patent
Williams et al.

(10) Patent No.: US 10,193,541 B1
(45) Date of Patent: Jan. 29, 2019

(54) TRANSFORMERLESS SWITCHING REGULATOR WITH CONTROLLABLE BOOST FACTOR

(71) Applicant: Siemens Medical Solutions USA, Inc., Malvern, PA (US)

(72) Inventors: Frederick Alan Williams, Bellevue, WA (US); Robert A. Hewitt, Sammamish, WA (US); David A. Petersen, Fall City, WA (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 0 days.

(21) Appl. No.: 15/703,870

(22) Filed: Sep. 13, 2017

(51) Int. Cl.
*H02M 3/156* (2006.01)
*H03K 17/06* (2006.01)
*H02M 1/08* (2006.01)
*H02M 3/158* (2006.01)

(52) U.S. Cl.
CPC ............ *H03K 17/063* (2013.01); *H02M 1/08* (2013.01); *H02M 3/1588* (2013.01)

(58) Field of Classification Search
CPC .................. H03K 17/063; H02M 1/08; H02M 3/156–3/158; H02M 3/1588; Y02B 70/126; Y02B 70/1466; G05F 1/607; G05F 3/12; G05F 3/18
USPC ........ 323/222, 223, 229, 231, 282, 290, 297
See application file for complete search history.

(56) References Cited

U.S. PATENT DOCUMENTS

| 6,903,535 B2 | 6/2005 | Liu et al. |
| 7,098,633 B1 | 8/2006 | Brokaw et al. |
| 8,345,512 B2 | 1/2013 | Adachi et al. |

OTHER PUBLICATIONS

Johnson, Stephanie. "Design for a Discrete Charge Pump," Texas Instruments. Jul. 2010.

*Primary Examiner* — Yemane Mehari

(57) ABSTRACT

For transformerless switching regulators, a current-mode controlled boost converter operates based on current sensing through a switch to ground, allowing use of common controllers. To avoid reverse current from a cascaded charge pump, the input of the charge pump is blocked by a diode from passing through the switch to ground and is itself separately switched to ground.

20 Claims, 3 Drawing Sheets

TRANSFORMERLESS SWITCHING REGULATOR WITH CONTROLLABLE BOOST FACTOR

BACKGROUND

The present embodiments relate to DC power conversion circuits. DC power conversion circuits generate a higher output voltage than the supply voltage. Three common DC power conversion circuits include boost converters, transformers, and charge pumps. Boost converters have a limited multiplication ratio due to parasitic resistances in the internal inductor. Multiple inductors in the boost configuration ("superboost") may be used to limit the parasitic resistances. Transformers have switching-frequency limitations. Specially-designed, and thus expensive, custom transformers may be used to avoid switching-frequency limitations. Charge pumps have current limits based on the parasitic resistances in the internal capacitors. Multiple parallel capacitors may be used to reduce the current limits.

Some uses, such as in transmitter circuits for medical diagnostic ultrasound imaging or for high power car stereos, rely on a combination of a boost converter with charge pump as a transformerless switching regulator. Standard peak-current based controllers, which rely on a grounded sense resistor to measure current in the boost converter may not operate correctly with this combination because the charge pump current corrupts the sensed current. The combination is limited to those less common and more expensive circuits using current sensing in the supply path rather than the ground return.

SUMMARY

By way of introduction, the preferred embodiments described below include methods, circuits, and systems for transformerless switching regulators. A current-mode controlled boost converter operates based on current sensing through a switch to ground, allowing use of common controllers. To avoid reverse current from a cascaded charge pump, the input of the charge pump is blocked by a diode from passing through the switch to ground and is itself separately switched to ground.

In a first aspect, a switching regulator system includes a controller. A boost converter includes an inductor and a first transistor responsive to a control signal from the controller. The first transistor connects with the inductor such that the inductor connects to ground through the first transistor. A charge pump has an input connected with an output of the boost converter. A diode connects between the inductor and the input of the charge pump. The diode connects to prevent current from the charge pump entering the first transistor. A second transistor responsive to the control signal connects to the input of the charge pump.

In a second aspect, a method is provided for transformerless switching regulation. An inductor of a boost converter is charged. During the charging, reverse current from a charge pump is blocked from reaching a current sensing path with a diode. During the charging, an input of the charge pump is connected to ground such that the reverse current flows to ground. The input of the charge pump is disconnected from ground and current from the inductor is released to the charge pump.

In a third aspect, a switching regulator includes a current-mode controlled boost converter and a voltage multiplier cascaded with the boost converter. Separate current paths are provided for sensing current during conduction through a switch to ground the inductor of the boost converter and for an input of the charge pump to ground.

The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE DRAWINGS AND PRESENTLY PREFERRED EMBODIMENTS

A transformerless switching regulator has a variable high boost factor due to the combination of a boost converter and a cascaded charge pump. The charge pump may be a doubler, tripler, or another higher-ratio circuit. To allow use with current-mode control, a diode isolates the inductor current from the charge pump current during the switch conduction phase of the main switching device of the boost converter, and an auxiliary switching device conducts the charge pump current during the switch conduction phase of the main switching device. The diode directs the backflow current to a secondary or auxiliary electronic switch. That way, the backflow current does not contribute to the current measured by the sense resistor, causing incorrect current measurement. The diode and auxiliary switching device separate the inductor current and the charge pump current, allowing accurate sensing of the inductor current using a resistor in the switch-to-ground connection as used in the great majority of integrated circuit controllers for boost converters. A source resistor in the auxiliary switching path provides control of the peak charging current through the charge pump and protects the auxiliary switching device from exceeding a safe operating area of the auxiliary switching device.

Figure 1:
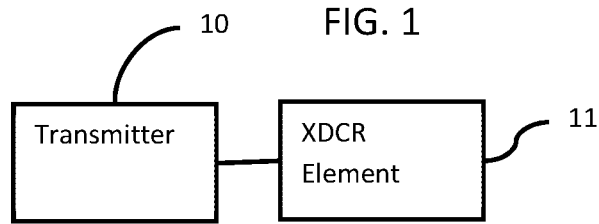
FIG. 1 is a block diagram of an ultrasound waveform generator according to one embodiment.

The switching regulator may be used in various circuits. For example, the switching regulator is used with a car stereo or other direct current (DC) environment where a programmable voltage setting greater than the supply is desired. FIG. 1 shows one embodiment using the switching regulator in a transmitter for ultrasound imaging. The transmitter 10 generates a waveform, such as a bipolar or unipolar square wave. The peak amplitude of the waveform may be different at different times or for different imaging applications. The switch circuit for generating the waveform may be supplied with direct current (DC) or a DC voltage. The switching regulator acts as the voltage source for the switch circuit. The switching regulator is controlled to provide the desired peak voltage for a given application or time.

The transmitter 10 connects to a transducer element 11. The transducer element 11 converts the electrical waveform into acoustic energy. By providing the transmitter 10 for each of a plurality of channels and corresponding elements 11, phased array ultrasound scanning may be provided at the desired peak voltage established by the switching regulator.

Figure 2:
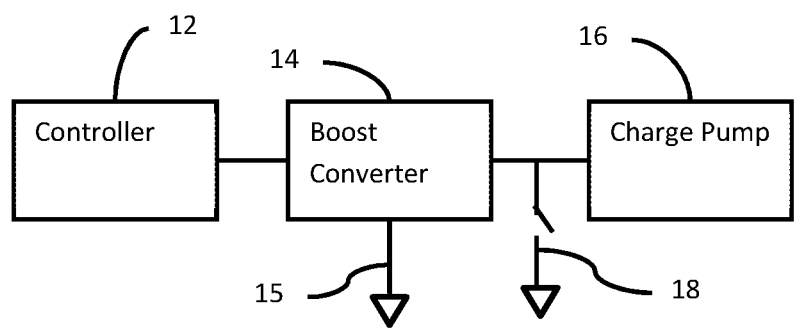
FIG. 2 is a block diagram of one embodiment of a transformerless switching regulator system.

FIG. 2 shows one embodiment of a switching regulator system. The switching regulator system includes a controller 12, a boost converter 14, a charge pump 16, and separate paths 15, 18 to ground. The separate paths 15, 18 allow cascading of the current-mode controlled boost converter 14 with the charge pump 16 while operating with a current-mode controller 12 of the boost converter 14. In the boost converter 14, a current through the switch in the path 15 is separated from the current through the path 18 of reverse current from the charge pump 16. These separate paths 15, 18 for inductor and charge pump currents during the switch conduction phase allow for current-mode sensing by the controller 12.

Additional, different, or fewer components may be provided. While the paths 15, 18 are shown as separate from the boost converter 14 and charge pump 18, one or both may be integrated or formed as part of one or both of these other circuits. For example, the path 15 is part of the boost converter, and the path 18 is separate from both or part of the boost converter 14 and/or charge pump 16. As another example, the controller 12 is not provided. In yet another example, additional charge pumps are cascaded.

The controller 12, boost converter 14, charge pump 16, path 15, and/or path 18 are integrated in a same circuit or chip. For example, an application specific integrated circuit includes the boost converter 14, path 15, charge pump 16, and path 18. The different components are formed using the same or different processes on the same semiconductor substrate, such as CMOS processes. In this example, the controller 12 is formed on a separate chip or application specific integrated circuit. In alternative embodiments, all or parts of each of the controller 12, boost converter 14, path 15, charge pump 16, and/or path 18 are formed of discrete components.

The switching regulator system is used within an ultrasound system. For example, an output of the charge pump 16 provides a DC voltage on a voltage rail. Pulsers or switches connect and disconnect a transducer element 11 from the voltage rail to generate an electrical waveform for ultrasound scanning. In another embodiment, the switching regulator system is part of a car stereo for controlling the voltage or peak amplitude of signals provided to speakers.

The controller 12 is an integrated circuit. Alternatively, discrete components are provided. A control signal from the controller 12 drives one or more switches in the boost converter 14, controlling operation of the boost converter 14. The gate drive of the controller 12 causes the boost converter 14 to provide a selectable boost or amplification of the supply voltage.

The controller 12 is a current mode controller. To operate the switch-mode converter (i.e., boost converter 14), the controller 12 opens and closes a switch. A current-mode controller measures the current through an inductor to determine the state of the electronic switch. This measurement may occur on either side of the switch, but circuit design may be simpler if the current is measured on the side of the switch connected to a common "ground" node rather than in the path to or from the inductor. This measurement is performed by a resistor, which converts the current into a voltage for further processing by the controller. To operate the boost converter 14, a current through the path 15 to ground from an inductor of the boost converter 14 is measured. The controller 14 includes a current sensor to sense a current from a drain, source, or emitter of the switch. Using a resistor in the path 15, the current is sensed by determining a voltage across the resistor. Other current sensing may be used. The controller 12 includes an input for the voltage. The voltage is used as feedback to operate the control signal for the boost converter 14.

Figure 3:
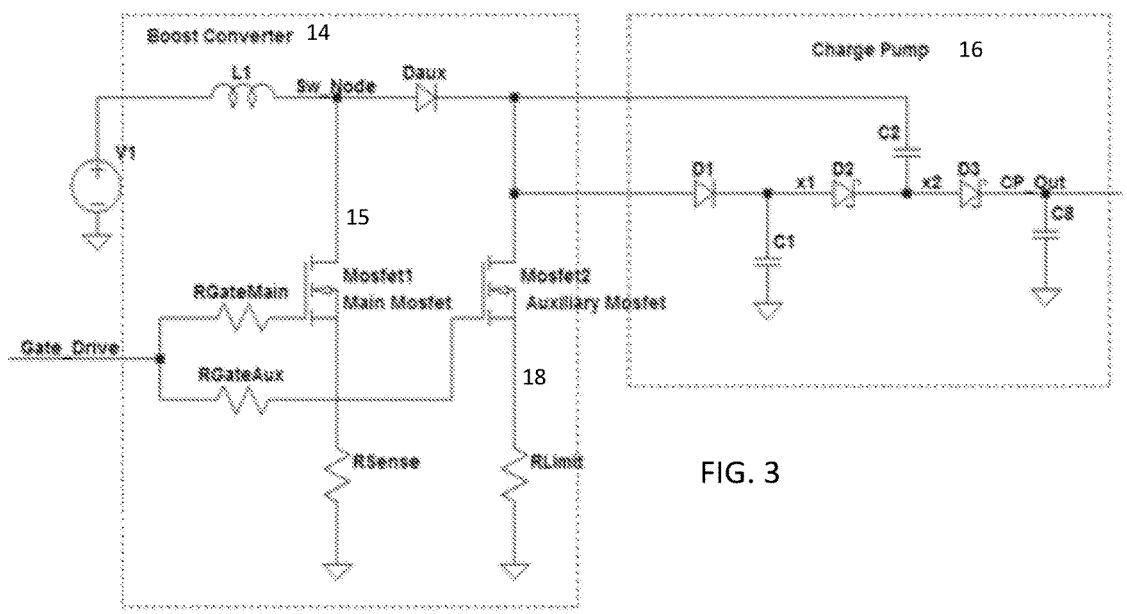
FIG. 3 is a circuit diagram of an example embodiment of a transformerless switching regulator.

The cascade of the boost converter 14 and the charge pump 16 provides a switching regulator. FIG. 3 shows one embodiment of a circuit diagram of the switching regulator. Switch-mode power conversion of the switching regulator uses at least two operating phases, one which stores energy in an inductor or capacitor, and another which transfers that energy. The energy which is transferred provides a change in voltage from the input supply voltage. During the "charging" phase, an electronic switch connects an inductor to a circuit so that current through the inductor increases, storing energy in the inductor. During a second "transfer" phase, the electronic switch is open, so that the current through the inductor must flow through an output switch (most commonly a diode) to an output. The inductor increases the voltage to a voltage sufficient to provide a continuous flow of current to the output. The formula for the voltage across the inductor is $V_L = L \, di/dt$, where L is the inductance and di/dt is the rate of change of the current. The voltage output may be higher than the input voltage because the rate of change of the current is only loosely connected to the voltage used to charge the inductor. The switching regulator is discussed below with reference to both FIGS. 2 and 3. Other circuits may be used.

The switching regulator includes an input for the control signal (Gate Drive) from the controller 12. Another input is provided for a fixed voltage source (V1). An output is provided for sensing the current through a resistor (RSense) in the path 15. Another output (CP Out) is of the selected voltage from the charge pump 16. A ground connection is also provided. Additional, different or fewer inputs and outputs may be provided.

The control input connects with both the switch (Mosfet1) in the current path 15 and the switch (Mosfet2) in the current path 18. These two current paths 15, 18 are separate, being separated by the diode (Daux). The two current paths 15, 18 are responsive to the same control signal (Gate Drive), but may be separately controlled.

The boost converter 14 includes one or more inductors (L1), the switch (Mosfet1), the current sensing resistor (RSense), and any other components (e.g., resistors (RGate-Main)). The inductor (L1) is in series between the input of the supply voltage source (V1) and the output to the charge pump 16. The boost converter 14 of FIG. 3 includes the path 15. The path 15 is formed from a terminal of the inductor (L1) (i.e., at an output of the boost converter 14 or node (Sw Node)) through the switch (Mosfet1) and sensing resistor (RSense)). Other paths, components, and/or connections may be provided.

The boost converter 14 is a current-mode controlled boost converter. The current output by the inductor (L1) during charging is grounded through the path 15. The inductor terminal of the node (Sw Node) is at or near ground, such as being about 0.5 volts. The current across the drain resistor (RSense) is sensed and used by the controller 12 to drive the switch (Mosfet1). Based on the control signal (Gate Drive) and sensed current feedback, the boost converter 14 provides a selected voltage on the output of the boost converter 14. By connecting the output of the inductor (L1) with the switch (Mosfet1), the on-time of the switch (Mosfet1) controls the voltage output by the inductor (L1) to the charge pump 16 when the path 15 is disconnected. Turning on the switch (Mosfet1) increases the current flow through the inductor (L1) for charging the inductor. This inductor-only (i.e., transformerless) switcher topology allows use of a standard current-mode controller 12, reducing cost and complexity. Non-standard controllers 12 may be used.

The switch (Mosfet1) is shown as a MOSFET. Other switches, such as a bipolar junction transistor, may be used. The gate connects to the input for the control signal from the controller 12. The source connects to the output of the inductor (L1). The drain connects to the resistor (RSense). Other connections may be used, such as reversing the source and drain connections. Other arrangements, including multiple switches with the same or independent control, may be used.

The switch (Mosfet1) turns the path 15 to ground on or off. The gate of the switch (Mosfet1) connects through a resistor (RGateMain) to the controller 12, so the switch (Mosfet1) is responsive to the control signal (Gate Drive) from the controller 12.

The charge pump 16 is a voltage multiplier cascaded with the boost converter 14 (i.e., output of the boost converter 14 is an input to the charge pump 16). The charge pump 16 charges one or more capacitors during a charging phase (often determined by the polarity of the input voltage and diodes), then transfers the charge to one or more other capacitors in a series-adding configuration during a second "transfer" phase. The current through a capacitor averages out to zero in a steady-state situation, so charge flowing into a charge pump during one phase is removed during another phase. This is "backflow" or reverse current, because the current flows backwards from the charge pump into the input voltage source.

An arrangement of diodes (D1-3) and capacitors (C1-2 and C8) are used. Other arrangements than shown may be used. For example, the charge pump 16 of FIG. 3 is for high positive voltages (e.g., 15 to 85 volts). A different arrangement is used for high negative voltages (e.g., −15 to −85) volts. Any now known or later developed charge pump may be used.

The capacitors (C1-2 and C8) are energy storage elements to increase or multiply the input voltage from the boost converter 14. The multiple is an integer amount (e.g., doubler or tripler), but other multiplier ratios (e.g., non-integer) may be used. While the boost converter 14 may be controlled to provide a different output voltage at different times, the charge pump 16 provides a fixed multiple of the input voltage from the boost converter 14. The output voltage of the charge pump 16 may be further boosted to higher values using additional stages of charge pumps. In general, a charge pump 16 has reduced cost and complexity over other DC power conversion topologies.

Current may flow in either direction in the charge pump 16. As a result, reverse or backflow current is provided at the input of the charge pump 16 when the path 15 grounds the output (Sw Node) of the boost converter 14 for charging the inductor (L1). Without the separate path 18, this reverse current would be added to the current from the inductor (L1), resulting in an incorrect current sensing for the current-mode controller 12. To allow for correct current sensing or feedback to the controller 12 in the switching regulator, the separate current paths 15, 18 are provided for the inductor (L1) and the input of the charge pump 16 during conduction of the switch (Mosfet1) of current from the inductor (L1) to ground.

The separate path 18 includes the diode (Daux), the auxiliary switch (Mosfet2), and a limiting resistor (RLimit). Additional, different, or fewer components may be provided (e.g., a resistor (RGateAux) at the gate of the auxiliary switch (Mostfet2)). The separate path 18 may, at least in part, be integrated into or formed as part of the boost converter 14 as shown in FIG. 3. In other embodiments, the path 18 is formed as a separate part or parts between the boost converter 14 and the charge pump 16 or is formed, at least in part, in the charge pump 16.

The diode (Daux) connects between the inductor (L1) and the input of the charge pump 16. The diode (Daux) separates the current paths 15, 18. While the switch (Mosfet1) conducts and current flows from the inductor (L1) to ground, the diode (Daux) prevents the reverse current from the charge pump 16 from entering the path 15. Since the diode (Daux) is between the two paths 15, 18 and both paths 15, 18 connect to ground, the voltage difference across the diode (Daux) is sufficiently small (e.g., less than 0.7 volts) to prevent conduction by the diode (Daux).

The auxiliary switch (Mosfet2) drains the reverse current from the charge pump 16 when the path 18 conducts. The auxiliary switch (Mosfet2) is a MOSFET, but other transistors (e.g., bipolar junction) or switches may be used. The auxiliary switch (Mosfet2) connects the input of the charge pump 16 with ground when conducting. The source connects to the input of the charge pump 16. The drain connects to a limiting resistor (RLimit). The gate connects to the controller 12 to receive the control signal (Gate Drive). Other connections may be used, such as reversing the drain and source.

The auxiliary switch (Mosfet2) and the main switch (Mosfet1) of the boost converter 14 are driven by the same control signal (Gate Drive). This dual control loop provides stability in measuring the current of the boost converter 14. Use of a diode (Daux) in series with the inductor (L1) and the added auxiliary switch (Mosfet2) controlled in parallel with the main boost converter 14 isolates the charge pump current from the main boost stage or boost converter 14, allowing the current controlled boost converter 14 to be controlled independently of the charge pump 16. The auxiliary switch (Mosfet2) drains current from the input of the charge pump 16 when the main switch (Mosfet1) of the boost converter 14 drains current through the inductor (L1), separating the currents on the two paths 15, 18. Both switches (Mosfet1 and Mosfet2) turn on and both turn off simultaneously. In alternative embodiments, different control signals are used for the different switches (Mosfet1 and Mosfet2) with or without different relative timing.

During conduction to charge the inductor (L1) by the switch (Mosfet1), the auxiliary switch (Mosfet2) also conducts. The simultaneous conduction prevents the reverse current from the charge pump 16 from interfering with the current sensing in the boost converter 14. Both paths 15, 18 are on at a same time and both paths 15, 18 are off at a same time.

When the paths 15, 18 are off (i.e., switches (Mosfet1 and Mosfet2) do not conduct), the current from the inductor (L1) enters the charge pump 16. The output voltage of the boost converter at the inductor (L1) is multiplied by the charge pump 16 at times when the paths 15, 18 are off.

The path 18 includes a resistor (RLimit). The resistor (RLimit) connects between the source or drain (emitter) of the auxiliary switch (Mosfet2) and ground. The resistor (RLimit) is sized to control of the peak charging current through the charge pump 16 and protects the auxiliary switch (Mosfet2) from exceeding a safe operating area (i.e., protects the auxiliary switch (Mosfet2) from collapse or damage).

Figure 4:
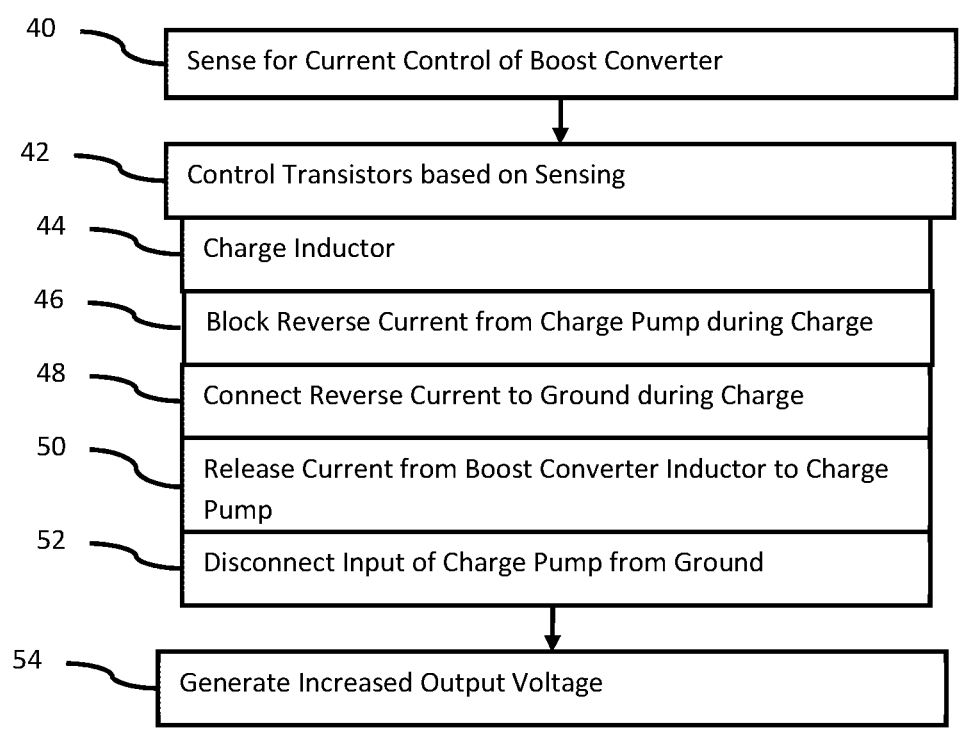
FIG. 4 is a flowchart diagram of one embodiment of a method for transformerless switching regulation.

FIG. 4 shows one embodiment of a method for transformerless switching regulation. By preventing reverse current of a cascaded charge pump from flowing through a current sensing path of a boost converter, a current-mode control may be used for the boost converter. Transformer circuits and high cost may be avoided by having a boost converter and charge pump cascade operable with current mode sensing.

The method is implemented for use in any of various circuits. For example, the method is implemented in an ultrasound probe that includes an integrated circuit for generating electronic waveforms to be applied to a transducer. The switching regulator allows use of lower cost controller and avoids use of a transformer, making integration into a handheld ultrasound transducer probe possible. In another example, the method is implemented in a car stereo or other environment with DC power conversion.

The method is implemented by the switching regulator system of FIG. 2, the switching regulator circuit of FIG. 3, or other cascaded boost converter and charge pump arrangements. Additional, different, or fewer acts may be provided.

The method is performed in the order shown (top to bottom or numerical). Other orders may be used. For example, acts 50 and 52 are performed simultaneously as performing act 52 results in performance of act 50. As another example, acts 46 and 48 are performed at all times during or for part of the time during the charging of act 44. In yet another example, act 40 is performed at various times, including during charging of act 44 and during release of act 50.

In act 40, a controller senses a voltage across a resistor connected with a main transistor of a boost converter. The boost converter includes an inductor. The inductor provides an output voltage to be increased by the charge pump. During operation, the inductor provides the voltage based on the amount of stored energy from current. To store, the main transistor connects the inductor to ground, resulting in the current being drawn from a voltage source through the inductor. The inductor is occasionally or periodically charged to the desired level to store the energy used to release current to the charge pump when not charging.

During the conduction by the main transistor to charge the inductor, the controller senses the current flowing through the inductor. The current is sensed by measuring a voltage across a resistor in the ground path, but other current sensing may be used. The control is performed during storage of the energy to control the amount of stored energy.

In act 42, the controller controls transistors based on the sensed current. Once the sensed current through the inductor reaches a threshold level, the controller turns off the transistors. After a given period or time, the controller turns on the transistors to again store energy. The gates of the transistors are controlled.

Two or more transistors are controlled. The main transistor of the boost converter for charging the inductor is controlled. Another transistor to prevent current from the charge pump from interfering with the sensing of act 40 is also controlled.

The transistors are controlled such that both are turned on at a same time and both are turned off at a same time. The same control signal operates both transistors. Other arrangements with relative delay between the transistors may be used.

Acts 44-52 provide one example of control of the transistors. Other acts may be used to isolate current from the charge pump from the boost converter during storage of energy in the inductor in the boost converter.

In act 44, the inductor is charged. Energy is stored in the inductor by passing current from a fixed voltage source through the inductor. To charge, the inductor is connected to ground. The connection is through the main transistor. By turning on the main transistor, the controller causes the inductor of the boost converter to be charged.

During the charging, the current passing through the inductor to ground is sensed in act 40. The controller senses the current to determine when to cease charging the inductor.

In act 46, reverse current from the charge pump is blocked from reaching the sensing of act 40. Current from the input of the cascaded charge pump does not indicate the level of charge of the inductor, so is blocked to avoid creating erroneous current sensing during charging.

A diode blocks the reverse current from the charge pump. The diode is positioned between (1) the inductor and the path to ground and (2) the input to the charge pump.

In act 48, the reverse current of the charge pump input is connected to ground during the charging. To cause the charge, the output terminal of the inductor is held at a low voltage, such as less than 0.7 volts. The diode blocks current from the charge pump. To prevent overcoming the diode, the other terminal of the diode is also connected to ground. The connection may be through a resistor, so the voltage is set to be similar to the output terminal of the inductor. The voltage difference across the diode is kept below 0.7 volts so that the diode blocks the reverse current from the grounding path for the inductor. The reverse current instead flows to ground.

The secondary transistor connects the input of the charge pump to ground. This causes any reverse current of the charge pump to follow a separate path than the path to ground used for sensing charging of the inductor.

In act 50, current is released from the inductor of the boost converter. Once the sensing of act 40 indicates sufficient or the desired amount of energy is stored in the inductor, the path to ground is removed. The controller controls the main transistor to turn off. Once the current is no longer directed to the path to ground, the current is provided to the input of the charge pump. The boost converter outputs the voltage at a level established by control of the main transistor.

In act 52, the input of the charge pump is disconnected from the secondary path to ground. The charge pump multiplies the input voltage, the input is disconnected from the path to ground. The controller turns off the main transistor to provide output by the boost converter and turns off the secondary transistor to allow the charge pump to multiply the output voltage.

Once charged, the controller controls both the main transistor and the secondary transistor to turn off. The transistors are turned off at the same time, allowing for output of the boosted voltage by the boost converter and multiplication of the output boosted voltage by the charge pump.

In act 54, the switching regulator generates an output voltage. The boosting converter boosts the voltage of the supply source. The amount of boost is controlled by the amount of stored energy in the inductor or inductors of the boost converter. The boost converter may be controlled to vary or set the amount of boost based on the sensing of act 40. The cascaded charge pump multiplies that boosted voltage, providing an output voltage at a desired level. The charge pump provides a fixed increase, such as through a fixed multiple.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

We claim:

1. A switching regulator system comprising:
a controller;
a boost converter comprising an inductor and a first transistor responsive to a control signal from the controller, the first transistor connected with the inductor such that the inductor connects to ground through the first transistor;
a charge pump having an input connected with an output of the boost converter;
a diode connected between the inductor and the input of the charge pump, the diode connected to prevent current from the charge pump entering the first transistor; and
a second transistor responsive to the control signal, the second transistor connected to the input of the charge pump.

2. The switching regulator system of claim 1 wherein the controller comprises a current sensor to sense a current from a drain of the first transistor, the controller configured to operate the control signal based on the sensed current.

3. The switching regulator system of claim 1 wherein the first and second transistors both turn on and both turn off simultaneously based on the control signal.

4. The switching regulator system of claim 1 wherein the second transistor is positioned to drain current from the charge pump when the first transistor drains current from the inductor.

5. The switching regulator system of claim 1 wherein the boost converter is operable to vary a voltage on the output of the boost converter based on the control signal, and wherein the charge pump is configured to increase the voltage by a fixed multiple.

6. The switching regulator system of claim 1 wherein the diode and the second transistor are arranged to separate current from the inductor from the current from the charge pump during conduction of the first and second transistors.

7. The switching regulator system of claim 1 further comprising a resistor connected with a source or emitter of the second transistor.

8. The switching regulator system of claim 1 wherein the controller comprises a current mode controller.

9. The switching regulator system of claim 1 wherein the first and second transistors comprise MOSFETs.

10. A method for transformerless switching regulation, the method comprising:
charging an inductor of a boost converter;
during the charging, blocking reverse current from a charge pump from reaching a current sensing path of the boost converter with a diode;
during the charging, connecting an input of the charge pump to ground such that the reverse current flows to ground;
releasing current from the inductor to the charge pump; and
disconnecting the input of the charge pump from ground during the releasing.

11. The method of claim 10 wherein charging comprises connecting the inductor to ground through a first transistor, and wherein connecting the input of the charge pump to ground comprises connecting through a second transistor.

12. The method of claim 11 further comprising controlling gates of the first and second transistors by a controller such that the first and second transistors are both turned on and turned off at a same time.

13. The method of claim 12 further comprising:
sensing a voltage across a resistor connected with the first transistor during the charging; and
controlling the first and second transistors based on the sensing.

14. The method of claim 10 further comprising generating an output voltage with the charge pump cascaded with the boost converter.

15. A switching regulator comprising:
a current-mode controlled boost converter;
a voltage multiplier cascaded with the boost converter; and
separate current paths for sensing current during conduction through a switch to ground the inductor of the boost converter and for an input of the charge pump to ground.

16. The switching regulator of claim 15, wherein the boost converter comprises the switch and the inductor with an output of the inductor connected to the switch.

17. The switching regulator of claim 15, wherein a diode separates the separate current paths.

18. The switching regulator of claim 15, wherein a first one of the current paths is from the inductor, through the switch, through a sense resistor, and to ground, wherein a second one of the current paths is from an input of the voltage multiplier through another switch, through a limit resistor, and to ground.

19. The switching regulator of claim 15 further comprising a control input connected with the switch in one of the separate current paths and with another switch in another of the separate current paths, the switch and the other switch both responsive to the control input.

20. The switching regulator of claim 15 wherein both separate current paths are off at times other than during the conduction through the switch, the inductor output multiplied by the voltage multiplier during the times.

* * * * *